(12) United States Patent
Ishigaki et al.

(10) Patent No.: US 6,812,534 B2
(45) Date of Patent: Nov. 2, 2004

(54) STATIC SEMICONDUCTOR MEMORY DEVICE

(75) Inventors: Yoshiyuki Ishigaki, Hyogo (JP); Tomohiro Hosokawa, Hyogo (JP); Yukio Maki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 10/365,503

(22) Filed: Feb. 13, 2003

(65) Prior Publication Data

US 2004/0046214 A1 Mar. 11, 2004

(30) Foreign Application Priority Data

Sep. 10, 2002 (JP) ........................................ 2002-264121

(51) Int. Cl.$^7$ ............................................. H01L 29/772
(52) U.S. Cl. ..................... 257/401; 257/204; 257/288; 257/369; 257/370; 257/903
(58) Field of Search ................................ 257/204, 288, 257/368, 369, 370, 401, 903, E27.098, E21.661

(56) References Cited

U.S. PATENT DOCUMENTS

| | | | | |
|---|---|---|---|---|
| 5,673,230 A | * | 9/1997 | Kuriyama | ................... 365/203 |
| 5,774,393 A | * | 6/1998 | Kuriyama | ................... 365/156 |
| 5,841,153 A | * | 11/1998 | Kuriyama et al. | ............ 257/69 |
| 5,994,719 A | * | 11/1999 | Kuriyama et al. | ............ 257/69 |
| 6,479,860 B2 | | 11/2002 | Ohbayashi | |
| 2002/0187621 A1 | * | 12/2002 | Nii et al. | ..................... 438/551 |

FOREIGN PATENT DOCUMENTS

JP            63-100771        5/1988

\* cited by examiner

*Primary Examiner*—George Fourson
*Assistant Examiner*—Joannie Adelle Garcia
(74) *Attorney, Agent, or Firm*—McDermott Will & Emery LLP (57) ABSTRACT

An SRAM comprises a memory cell including first and second access nMOS transistors, first and second driver nMOS transistors and first and second load pMOS transistors, polysilicon wires forming gates of the first and second access nMOS transistors and polysilicon wires extending in the same direction as the polysilicon wires for forming gates of the first and second driver nMOS transistors and gates of the first and second load pMOS transistors. The gate widths of the first and second access nMOS transistors and those of the first and second driver nMOS transistors are equalized with each other.

9 Claims, 8 Drawing Sheets

STATIC SEMICONDUCTOR MEMORY DEVICE

BACKGROUND OF THE INVENTION

1. Field of the Invention

The present invention relates to a static semiconductor memory device, and more particularly, it relates to the structure of a memory cell of a static semiconductor memory device (SRAM: static random access memory) comprising memory cells (hereinafter referred to as "full CMOS cells") each including six MOS (metal oxide semiconductor) transistors.

2. Description of the Background Art

Figure 11:
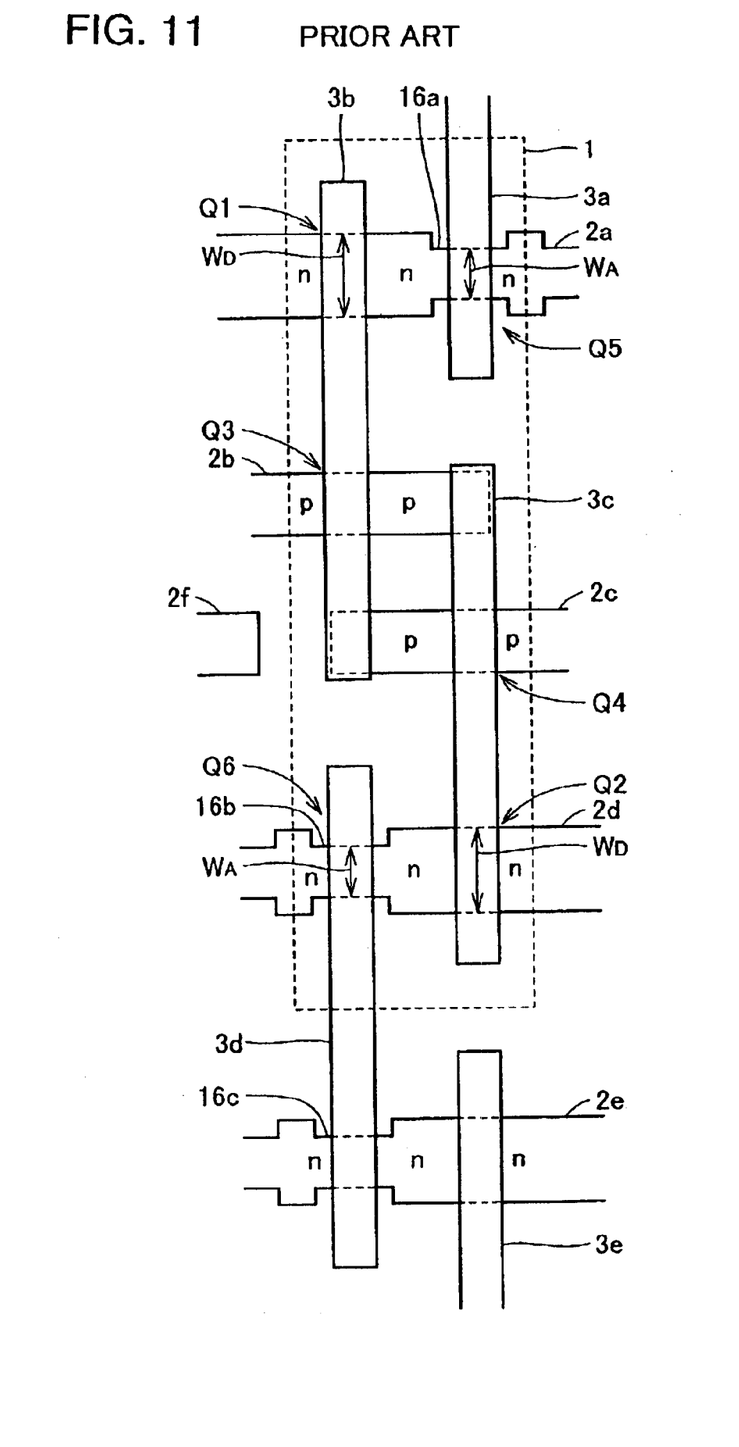
FIG. 11 is a plan view showing the layout of polysilicon wires and active regions in a memory cell of a conventional SRAM.

FIG. 11 shows an exemplary structure of a memory cell 1 of a conventional SRAM. For the convenience of illustration, FIG. 11 shows only polysilicon wires 3a to 3e forming gates of MOS transistors without showing wires located above the polysilicon wires 3a to 3e.

As shown in FIG. 11, the memory cell 1 includes six MOS transistors Q1 to Q6. More specifically, the memory cell 1 includes first and second driver nMOS transistors Q1 and Q2, first and second load pMOS transistors Q3 and Q4 and first and second access nMOS transistors Q5 and Q6.

The first driver nMOS transistor Q1 is formed on the intersection between an active region 2a and the polysilicon wire 3b, the second driver nMOS transistor Q2 is formed on the intersection between an active region 2d and the polysilicon wire 3c, the first load pMOS transistor Q3 is formed on the intersection between an active region 2b and the polysilicon wire 3b, the second load pMOS transistor Q4 is formed on the intersection between an active region 2c and the polysilicon wire 3c, the first access nMOS transistor Q5 is formed on the intersection between the active region 2a and the polysilicon wire 3a, and the second access nMOS transistor Q6 is formed on the intersection between the active region 2d and the polysilicon wire 3d.

Figure 12:
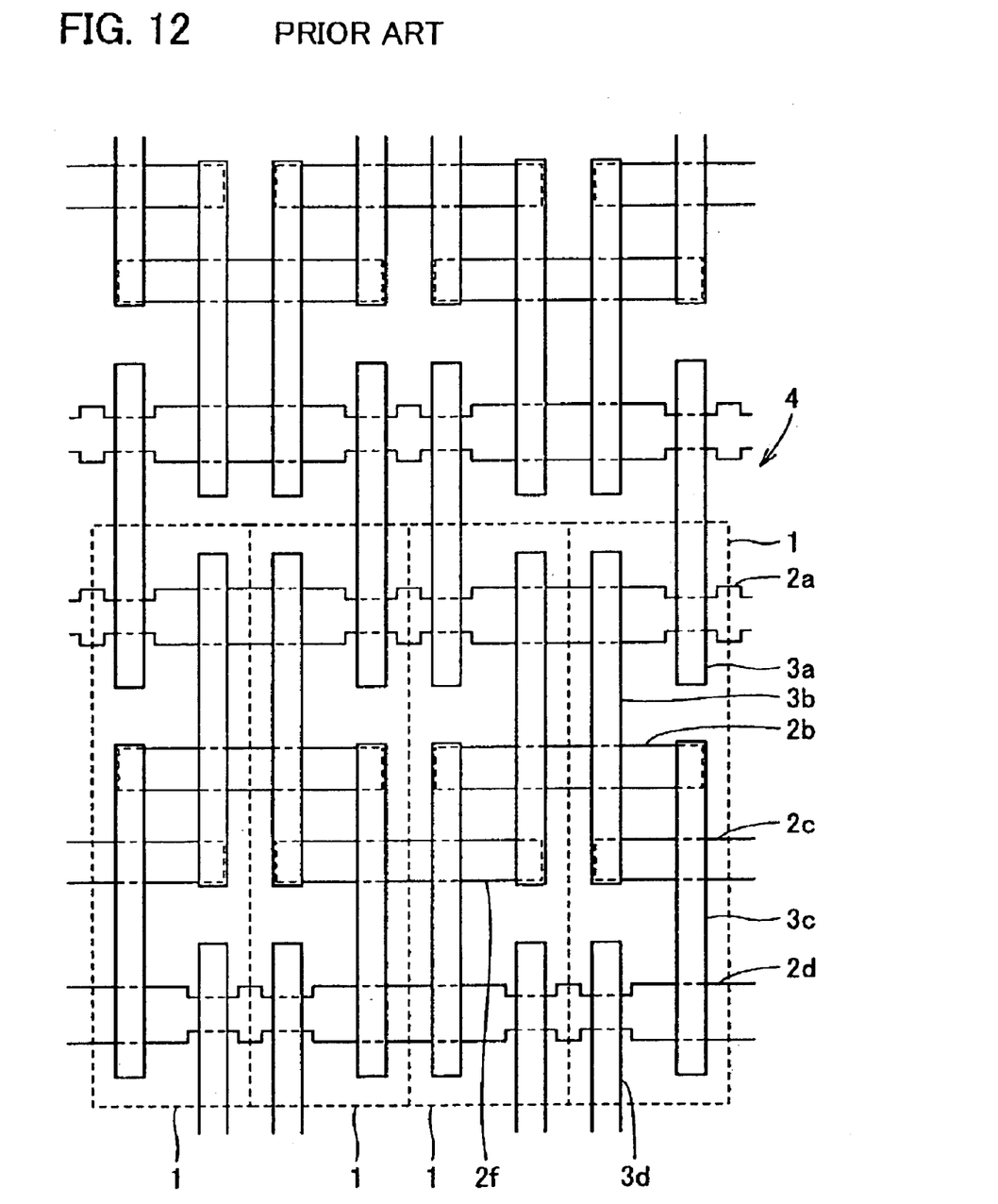
FIG. 12 is a plan view showing the layout of the polysilicon wires and the active regions in a memory cell array of the conventional SRAM.

A large number of memory cells 1 having the aforementioned structure are so arranged as to form a memory cell array 4, as shown in FIG. 12. Referring to FIG. 11, active regions 2f and 2e and a polysilicon wire 3e belong to other memory cells 1 adjacent to this memory cell 11 respectively.

When a power supply voltage is increased, a memory cell current is increased to subsequently increase a ground potential GND of the memory cell 1. Therefore, the operating margin of the SRAM is disadvantageously reduced.

In order to prevent such inconvenience, the gate width WA of the access nMOS transistors Q5 and Q6 is reduced below the gate width WD of the driver nMOS transistors Q1 and Q2 thereby reducing the current. More specifically, narrow potions 16a to 16c are provided on the active regions 2a, 2d and 2e respectively while the gate width WA of the first and second access nMOS transistors Q5 and Q6 is reduced below the gate width WD of the first and second driver nMOS transistors Q1 and Q2 as shown in FIG. 11.

On the other hand, Japanese Patent Laying-Open No. 63-100771 (1988), for example, describes a static memory including transfer transistors and driver transistors having substantially identical gate widths. In the static memory described in this gazette, however, each diffusion layer itself has a complicated structure.

When the active regions 2a, 2d and 2e are provided with the narrow portions 16a to 16c respectively as described above, the shapes thereof are complicated. This results in the following problem:

In order to form the active regions 2a to 2f, resist patterns having shapes corresponding to those of the active regions 2a to 2f are generally formed by photolithography for performing prescribed processing with the resist patterns. When the active regions 2a, 2d and 2e have complicated shapes as described above, however, resolution in formation of the resist patterns is so reduced by light interference or the like that it is difficult to form the resist patterns in desired shapes. Therefore, the shapes of the active regions 2a, 2d, 2e etc. formed through these resist patterns are also dispersed. Consequently, no desired device characteristics are attained but the reliability of the SRAM is disadvantageously reduced.

Particularly the narrow portions 16a to 16c smaller in width than the remaining portions of the active regions 2a, 2d and 2e are remarkably influenced by fluctuation of the width. This leads to remarkable fluctuation of the gate width WA of the access nMOS transistors Q5 and Q6 and remarkable dispersion of the characteristics of the access nMOS transistors Q5 and Q6. Thus, the performance of the SRAM is disadvantageously reduced.

The aforementioned problem conceivably further remarkably arises as the memory cell 1 of the SRAM is refined. When the active regions 2a to 2f have simple shapes such as linear shapes as shown in FIG. 11, the widths of the remaining portions of the active regions 2a to 2f other than the aforementioned narrow portions 16a to 16c are conceivably less remarkably fluctuated, conceivably leading to significant influence exerted on the device characteristics by fluctuation of the widths of the narrow portions 16a to 16c.

SUMMARY OF THE INVENTION

Accordingly, an object of the present invention is to provide a static semiconductor memory device exhibiting high performance and high reliability also when the same is refined.

The static semiconductor memory device according to the present invention comprises a memory cell including an access MOS (metal oxide semiconductor) transistor, a driver MOS transistor and a load MOS transistor, a first wire forming the gate of the access MOS transistor and a second wire extending in the same direction as the first wire for forming the gate of the driver MOS transistor and the gate of the load MOS transistor. The gate width of the access MOS transistor and that of the driver MOS transistor are equalized with each other.

When the gate width of the access MOS transistor and that of the driver MOS transistor are equalized with each other, no narrow portion may be provided on an active region including source and drain regions of the access MOS transistor and the driver MOS transistor. Thus, this active region can be provided in a simple linear shape, so that all active regions including those other than this active region can be simply linearly shaped.

The gate width of the aforementioned load MOS transistor may be rendered smaller than the gate width of the access MOS transistor and that of the driver MOS transistor or larger than the gate width of the access MOS transistor and that of the driver MOS transistor, or may be equalized with the gate width of the access MOS transistor and that of the driver MOS transistor.

Figure 1:
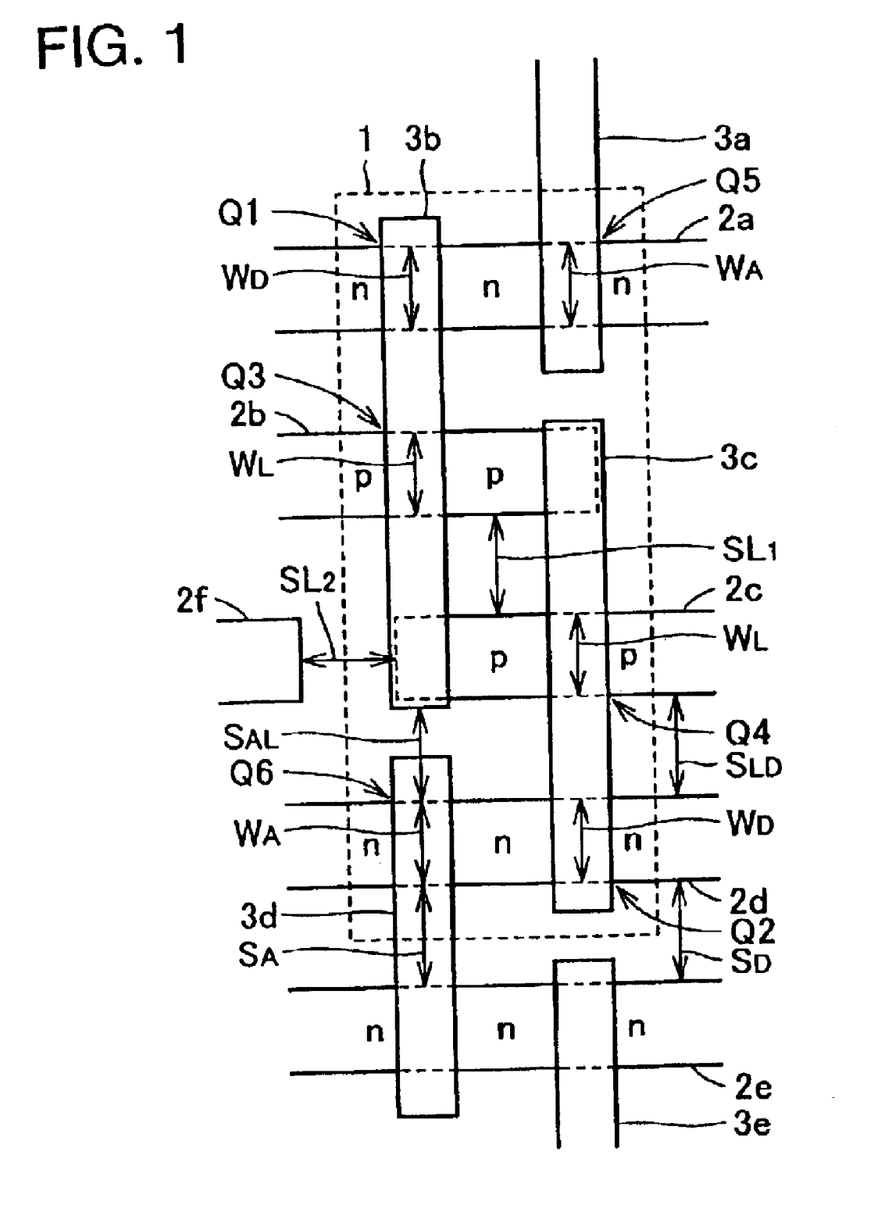
FIG. 1 is a plan view showing the layout of polysilicon wires and active regions in a memory cell of an SRAM according to a first embodiment of the present invention.

A first separation width (corresponding to a separation width SA in FIG. 1) between access MOS transistors adjacent to each other along the gate width direction of the aforementioned access MOS transistor, a second separation width (corresponding to a separation width SD in FIG. 1)

between driver MOS transistors adjacent to each other along the gate width direction of the driver MOS transistor and a third separation width (corresponding to a separation width SL1 in FIG. 1) between load MOS transistors adjacent to each other along the gate width direction of the load MOS transistor may be equalized with each other.

A fourth separation width (corresponding to a separation width SL2 in FIG. 1) between load MOS transistors adjacent to each other along the gate length direction of the load MOS transistor and the aforementioned first, second and third separation widths may be equalized with each other.

A fifth separation width (corresponding to a separation width SLD in FIG. 1) between the load MOS transistor and the driver MOS transistor adjacent to each other along the gate width direction of the aforementioned load MOS transistor, a sixth separation width (corresponding to a separation width SAL in FIG. 1) between the load MOS transistor and the access MOS transistor adjacent to each other along the gate width direction of the access MOS transistor and the aforementioned first, second and third separation widths may be equalized with each other.

The aforementioned static semiconductor memory device further comprises an active region including a source region and a drain region of the load MOS transistor. In this case, the active region is preferably continuously formed between load MOS transistors adjacent to each other along the gate length direction of the load MOS transistor, and an isolation element is preferably formed on the active region located between the load MOS transistors. The isolation element may include a MOS transistor having a higher threshold voltage than the load MOS transistor.

A trench isolation region may be provided to divide the active region located between the load MOS transistors adjacent to each other along the gate length direction of the load MOS transistor. This trench isolation region is preferably prepared through an active region forming pattern obtained by forming an active region forming base pattern consisting of a simple line-and-space pattern, for example, and thereafter forming a trench forming hole pattern on a prescribed position of the base pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 10.

First Embodiment

Figure 2:
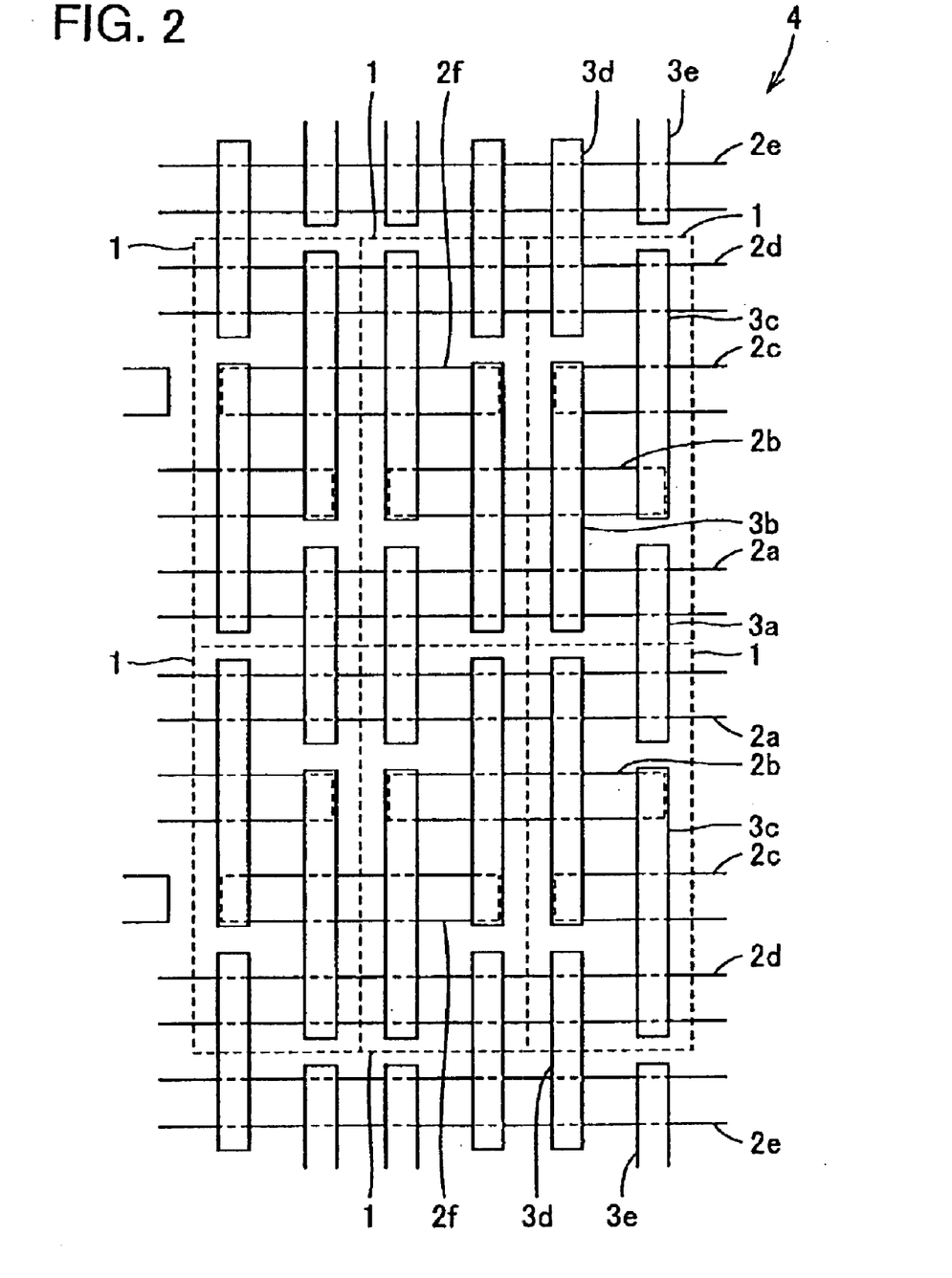
FIG. 2 is a plan view showing the layout of the polysilicon wires and the active regions in a memory cell array of the SRAM according to the first embodiment of the present invention.

FIG. 1 is a plan view of a memory cell 1 of an SRAM (static semiconductor memory device) according to a first embodiment of the present invention. FIG. 2 is a plan view showing a memory cell array 4 of the SRAM according to the first embodiment. For the convenience of illustration, FIGS. 1 and 2 show only polysilicon wires and active regions, without illustrating wires and contact holes located above the polysilicon wires.

The SRAM comprises a memory cell array region formed with the memory cell 1 shown in FIG. 1 and a peripheral circuit region formed with a peripheral circuit controlling operations of the memory cell 1.

The memory cell 1 having a full CMOS cell structure comprises first and second inverters and two access MOS transistors. The first inverter includes a first driver nMOS transistor Q1 and a first load pMOS transistor Q3, and the second inverter includes a second driver nMOS transistor Q2 and a second load pMOS transistor Q4.

Inputs and outputs of the first and second inverters are connected with each other to form a flip-flop, so that the source of a first access nMOS transistor Q5 is connected to a first storage node of the flip-flop and the source of a second access nMOS transistor Q6 is connected to a second storage node of the flip-flop.

The memory cell 1 further comprises a first p-well region, an n-well region and a second p-well region vertically arranged along the extensional direction of polysilicon wires 3a to 3e in FIG. 1. The first driver nMOS transistor Q1 and the first access nMOS transistor Q5 are formed on the first p-well region, the first and second load pMOS transistors Q3 and Q4 are formed on the centrally located n-well region and the second driver nMOS transistor Q2 and the second access nMOS transistor Q6 are formed on the second p-well region.

A plurality of transversely extending active regions 2a to 2f are selectively formed in the p-well regions and the n-well region, and the polysilicon wires (replaceable with polycide wires) 3a, 3b, 3c, 3d an 3d are formed to vertically extend above the active regions 2a to 2f.

As shown in FIG. 1, each of the active regions 2a to 2f and the polysilicon wires 3a to 3e has a simple linear shape. Thus, the active regions 2a to 2f and the polysilicon wires 3a to 3e are so simply shaped that mask patterns (e.g., resist patterns) for patterning the active regions 2a to 2f and the polysilicon wires 3a to 3e can be precisely formed for inhibiting the active regions 2a to 2f and the polysilicon wires 3a to 3e from misregistration or dispersion in shape. Therefore, margins necessary between the active regions 2a to 2f and between the polysilicon wires 3a to 3e can be reduced in size, to consequently reduce the area of the memory cell 1.

The active region 2a includes n-type impurity regions defining source and drain regions of the first access nMOS transistor Q5 as well as n-type impurity regions defining source and drain regions of the first driver nMOS transistor Q1, and the active region 2d includes n-type impurity regions defining source and drain regions of the second access nMOS transistor Q6 as well as n-type impurity regions defining source and drain regions of the second driver nMOS transistor Q2. The active region 2e belonging to a lower memory cell includes n-type impurity regions.

The active region 2b includes p-type impurity regions defining source and drain regions of the first load pMOS transistor Q3, and the active region 2c includes p-type impurity regions defining source and drain regions of the second load pMOS transistor Q4. The active region 2f belonging to a left memory cell includes p-type impurity regions.

The first driver nMOS transistor Q1 is formed on the intersection between the active region 2a and the polysilicon wire 3b, and the second driver nMOS transistor Q2 is formed on the intersection between the active region 2d and the polysilicon wire 3c. The first load pMOS transistor Q3 is formed on the intersection between the active region 2b and the polysilicon wire 3b, and the second load pMOS transistor Q4 is formed on the intersection between the active region 2c and the polysilicon wire 3c. The first access nMOS transistor Q5 is formed on the intersection between the active region 2a and the polysilicon wire 3a, and the second access nMOS transistor Q6 is formed on the intersection between the active region 2d and the polysilicon wire 3d.

The polysilicon wire 3b defines gates of the first driver nMOS transistor Q1 and the first load pMOS transistor Q3, and the polysilicon wire 3c defines gates of the second driver nMOS transistor Q2 and the second load pMOS transistor Q4. The polysilicon wires 3a and 3d define gates of the first and second access nMOS transistors Q5 and Q6. The gates of the first and second access nMOS transistors Q5 and Q6 are connected to a word line (not shown).

According to this embodiment, gate widths WA and WD of the first access nMOS transistor Q5 and the first driver nMOS transistor Q1 are equalized with each other, and gate widths WA and WD of the second access nMOS transistor Q6 and the second driver nMOS transistor Q2 are also equalized with each other, as shown in FIG. 1. Therefore, the portions formed with the first and second access nMOS transistors Q5 and Q6 may be provided with no narrow portions but the active regions 2a and 2d can be linearly (straightly) shaped with substantially uniform widths.

Thus, fluctuation of the widths of the active regions 2a and 2d having no narrow potions can be remarkably reduced in the portions formed with the first and second access nMOS transistors Q5 and Q6 as compared with the prior art. Consequently, the SRAM can be effectively inhibited from reduction in reliability and performance.

Also when the gate widths WA and WD of the first access nMOS transistor Q5 and the first driver nMOS transistor Q1 are equalized with each other as described above, an operation margin of the SRAM can be ensured by reducing a power supply voltage to not more than about 1.2 V to 1.5 V, for example.

The structure of the memory cell 1 of the SRAM according to the first embodiment of the present invention is now described in more detail.

As shown in FIG. 1, the first load pMOS transistor Q3 may have a gate width WL smaller than the gate widths WA and WD of the first access nMOS transistor Q5 and the first driver nMOS transistor Q1, and the second load pMOS transistor Q4 may also have the gate width WL smaller than the gate widths WA and WD of the second access nMOS transistor Q6 and the second driver nMOS transistor Q2.

In other words, the widths of active regions including source and drain regions of load MOS transistors are rendered smaller than the widths of active regions including source and drain regions of access MOS transistors and driver MOS transistors. Thus, the driver MOS transistors exhibit current drivability remarkably exceeding that of the load MOS transistors, whereby storage nodes of the SRAM can be readily forcibly set to a low level for a write operation, thereby stabilizing the write operation of the SRAM.

Alternatively, the gate width WL of the first load pMOS transistor Q3 may be larger than the gate widths WA and WD of the first access nMOS transistor Q5 and the first driver nMOS transistor Q1, and the gate width WL of the second load pMOS transistor Q4 may also be larger than the gate widths WA and WD of the second access nMOS transistor Q6 and the second driver nMOS transistor Q2.

In other words, the widths of the active regions including the source and drain regions of the load MOS transistors are rendered larger than the widths of the active regions including the source and drain regions of the access MOS transistors and the driver MOS transistors. In this case, the current drivability of the load MOS transistors is so improved that high-level data on the storage nodes can be readily kept at a power supply voltage Vcc for preventing the data from destruction resulting from potential reduction of a high-level side storage node after a read operation and stabilizing the read operation of the SRAM.

Further alternatively, the gate width WL of the first load pMOS transistor Q3 may be equalized with the gate widths WA and WD of the first access nMOS transistor Q5 and the first driver nMOS transistor Q1, and the gate width WL of the second load pMOS transistor Q4 may also be equalized with the gate widths WA and WD of the second access nMOS transistor Q6 and the second driver nMOS transistor Q2.

In other words, the widths of the active regions including the source and drain regions of the load MOS transistors are equalized with the widths of the active regions including the source and drain regions of the access MOS transistors and the driver MOS transistors. Thus, all active regions can be substantially uniform in width and inhibited from dispersion in width after formation thereof. Consequently, margins between the active regions can be reduced for further reducing the area of the memory cell 1.

As shown in FIG. 1, a first separation width SA between the access MOS transistors, a second separation width SD between the driver MOS transistors and a third separation width SL1 between the load MOS transistors are preferably equalized with each other. Thus, the active regions can be regularly vertically arranged along the extensional direction of the polysilicon wires 3a to 3e, and the active region patterns can be further precisely formed. This can also contribute to further reduction of the area of the memory cell 1.

More specifically, the first separation width SA corresponds to that between the second access nMOS transistor Q6 and an access nMOS transistor, provided in another memory cell located under the second access nMOS transistor Q6, adjacent thereto along the gate width (WA) direction of the second access nMOS transistor Q6, for example.

The second separation width SD corresponds to that between the second driver nMOS transistor Q2 and a driver nMOS transistor, provided in another memory cell located under the second driver nMOS transistor Q2, adjacent thereto along the gate width (WD) direction of the second driver nMOS transistor Q2, for example.

The third separation width SL1 corresponds to that between the first and second load pMOS transistors Q3 and Q4 along the gate width (WL) direction.

Further, the first, second and third separation widths SA, SD and SL1, equalized with each other as described above, are preferably equalized with a fourth separation width SL2 described below. In this case, the active regions are further regularly arranged and the area of the memory cell 1 can be further reduced.

The fourth separation width SL2 corresponds to that between load pMOS transistors adjacent to each other along the gate length direction thereof, i.e., the distance between the active region 2c and the active region 2f adjacent thereto along the gate length direction of the second load pMOS transistor Q4 in FIG. 1.

The aforementioned first to third separation widths SA, SD and SL1 may further be equalized with a fifth separation width SLD between a load MOS transistor and a driver MOS transistor adjacent to each other along the gate width direction of the load MOS transistor and a sixth separation width SAL between a load MOS transistor and an access MOS transistor adjacent to each other along the gage width direction of the access MOS transistor.

In this case, the intervals between the active regions 2a to 2e shown in FIG. 1 can be so uniformalized that the active regions 2a to 2e can be further precisely formed. Thus, the area of the memory cell 1 can be further reduced.

The fifth separation width SLD corresponds to that between the second load pMOS transistor Q4 and the second driver nMOS transistor Q2 adjacent thereto along the gate width (WL) direction of the second load pMOS transistor Q4 in FIG. 1, for example.

The sixth separation width SAL corresponds to that between the second access nMOS transistor Q6 and the second load pMOS transistor Q4 adjacent thereto along the gate width (WA) direction of the second access nMOS transistor Q6 in FIG. 1.

A plurality of metal wires are formed on the aforementioned polysilicon wires 3a to 3e through an interlayer dielectric film. These metal wires are employed for forming word lines, power supply (VDD) lines, ground (GND) lines and bit lines respectively.

Second Embodiment

An SRAM according to a second embodiment of the present invention is described with reference to FIGS. 3 and 4. According to the second embodiment, active regions are continuously formed between load MOS transistors adjacent to each other along the gate length direction thereof, i.e., a direction perpendicular to a gate width (WL) direction (transverse direction in FIG. 3) and isolation elements are formed on the active regions located between the load MOS transistors.

Figure 3:
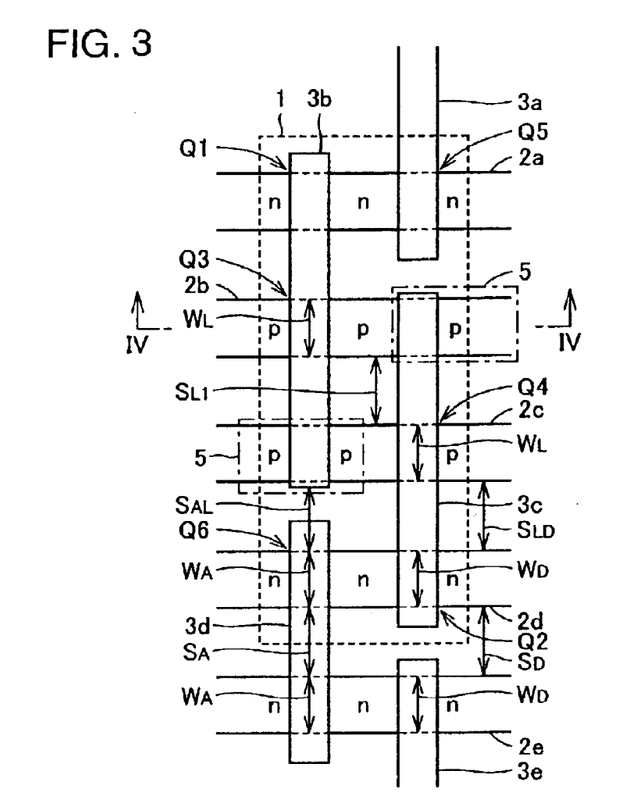
FIG. 3 is a plan view showing the layout of polysilicon wires and active regions in a memory cell of an SRAM according to a second embodiment of the present invention.

More specifically, an active region 2b including p-type impurity regions is extended along the gate length direction of a first load pMOS transistor Q3 and connected with an active region of another memory cell 1 adjacent to a memory cell 1 shown in FIG. 3 for forming a high threshold voltage (Vth) region 5 on a prescribed position of the active region 2b, while an active region 2c including p-type impurity regions is extended along the gate length direction of a second load pMOS transistor Q4 and connected with another active region (the active region 2f in the first embodiment shown in FIG. 1) of the other memory cell 1 adjacent to this memory cell 1 along the gate length direction for forming another high threshold voltage (Vth) region 5 on a prescribed position of the active region 2c, as shown in FIG. 3. The remaining structure of the memory cell 1 according to the second embodiment is identical to that of the first embodiment.

The high threshold voltage (Vth) regions 5 are so formed that load pMOS transistors located on both sides thereof can be electrically isolated from each other.

Active region patterns and isolation region patterns define simple line-and-space field patterns vertically arranged along the extensional direction of the polysilicon wires 3a to 3e in FIG. 3. Thus, high optical resolution can be implemented for forming mask patterns such as resist patterns for forming the field patterns, so that the field patterns can be readily and precisely formed and the intervals between the patterns can be reduced. This can also contribute to reduction of the area of the memory cell 1.

An exemplary sectional structure of each high threshold voltage (Vth) region 5 is described with reference to FIG. 4. FIG. 4 is a sectional view taken along the line IV—IV in FIG. 3.

Figure 4:
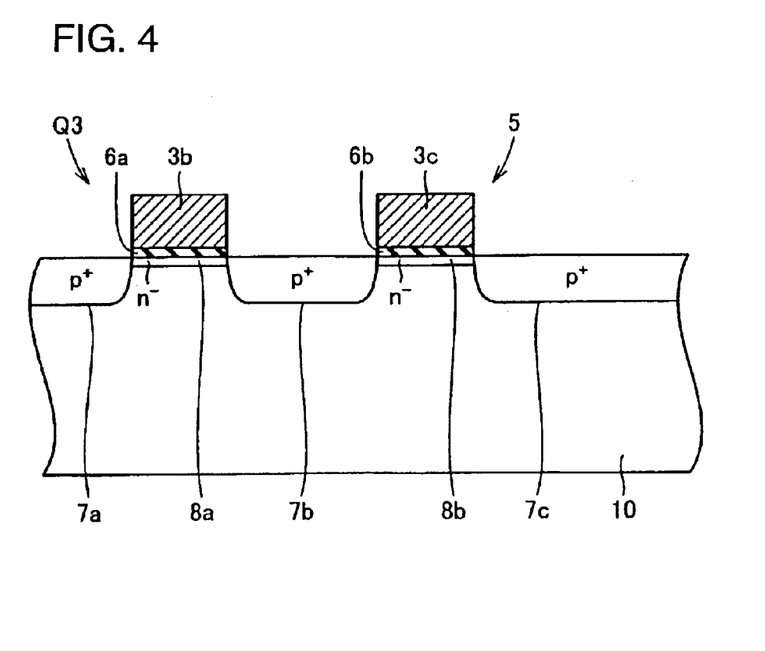
FIG. 4 is a sectional view taken along the line IV—IV in FIG. 3.

As shown in FIG. 4, the second embodiment employs a MOS transistor as each isolation element. The threshold voltage of the isolation MOS transistor is increased to about 1.6 V for electrically isolating elements from each other. The upper limit of the threshold voltage of the isolation transistor is about 1.6 V in general and hence transistor isolation cannot be employed when a power supply voltage is in excess of 1.6 V.

However, the power supply voltage can be reduced to about 1.5 V or about 1.2 V under a 0.15 $\mu$m rule or a 0.13 $\mu$m rule. When the power supply voltage is reduced to not more than about 1.5 V, transistor isolation can be employed.

As shown in FIG. 4, the high threshold voltage (Vth) region 5 has a pMOS transistor including $p^+$ impurity regions 7b and 7c formed on the main surface of a p-type silicon substrate (semiconductor substrate) 10, an n+ impurity region 8b formed between the p+ impurity regions 7b and 7c and a gate electrode (polysilicon wire) 3c formed on the $n^-$ impurity region 8b through a gate insulator film 6b.

A first load pMOS transistor Q3 is formed adjacently to the high threshold voltage (Vth) region 5. The first load pMOS transistor Q3 has p+ impurity regions 7a and 7b, an n+ impurity region 8a corresponding to a channel region, a gate insulator film 6b and a gate electrode (polysilicon wire) 3b.

The concentration of an n-type impurity contained in the n+ impurity region 8b of the aforementioned pMOS transistor is set to about $5 \times 10^{18}/cm^3$ to $5 \times 10^{20}/cm^3$ (preferably about $1 \times 10^{19}/cm^3$), and the threshold voltage of the isolation pMOS transistor formed in the high threshold voltage (Vth) region 5 is set to about 1.6 V.

At this time, the concentrations of n-type impurities contained in the $n^-$ impurity region 8a of the first load pMOS transistor Q3 and an $n^-$ impurity region of the second load pMOS transistor Q4 are set lower than the concentration of the n-type impurity contained in the $n^-$ impurity region 8b. Thus, the threshold voltages of the first and second load pMOS transistors Q3 and Q4 can be reduced below that of the isolation pMOS transistor, which in turn can isolate the load MOS transistors adjacent to each other.

In order to increase the concentration of the n-type impurity contained in the n+ impurity region 8b beyond those of the n-type impurities contained in the n+ impurity region 8a and the like, the n-type impurity, such as arsenic, for example, for forming the n+ impurity region 8a may be introduced also into a region for forming the n+ impurity region 8b when forming the n+ impurity region 8a while introducing a prescribed amount of the n-type impurity into the region for forming the n+ impurity region 8b in another step, for example.

Also in this embodiment, a first separation width SA between access MOS transistors, a second separation width SD between driver MOS transistors and a third separation width SL1 between load MOS transistors are preferably equalized with each other.

More preferably, the aforementioned first to third separation widths SA, SD and SL1 are equalized with a fifth separation width SLD between a load MOS transistor and a driver MOS transistor adjacent to each other along the gate width direction of the load MOS transistor and a sixth separation width SAL between an access MOS transistor and a load MOS transistor adjacent thereto along the gate width direction of the access MOS transistor.

Third Embodiment

Figure 5:
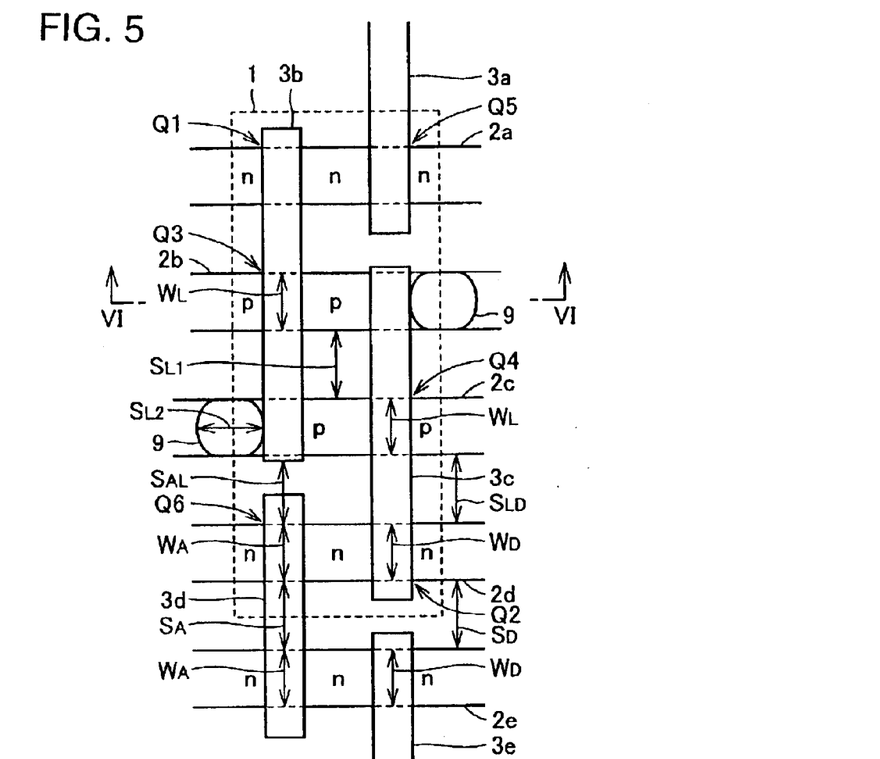
FIG. 5 is a plan view showing the layout of polysilicon wires and active regions in a memory cell of an SRAM according to a third embodiment of the present invention.

A memory cell 1 of an SRAM according to a third embodiment of the present invention is described with reference to FIGS. 5 to 10. According to the third embodiment, element isolation regions 9 are formed for dividing active regions located between load MOS transistors adjacent to each other along the gate length direction thereof, as shown in FIG. 5.

Each element isolation region 9 is formed through a mask pattern prepared by forming a base mask pattern corresponding to the base shape (identical to the shape of each active region pattern shown in FIG. 3) of an active region pattern excluding the pattern of the element isolation region 9 and working the base mask pattern for adding a hole pattern for forming the element isolation region 9 to the base mask pattern in a later step.

Figure 6:
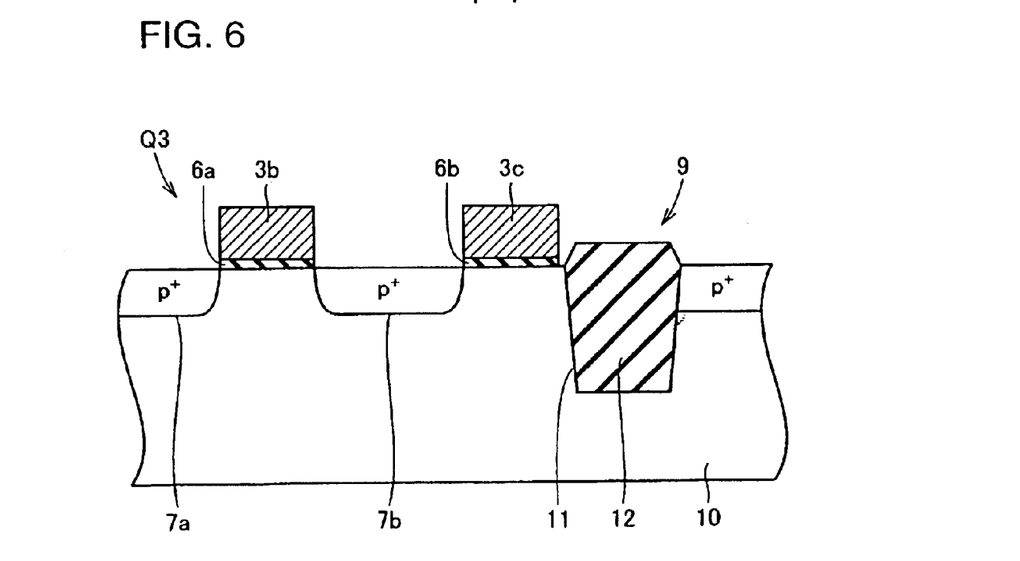
FIG. 6 is a sectional view taken along the line VI—VI in FIG. 5.

Referring to FIG. 6, a trench isolation region is employed as the element isolation region 9. More specifically, a trench 11 is formed to pass through a prescribed region of an active region 2b and filled up with a silicon oxide film (insulator film 12), thereby forming the element isolation region 9.

When the pattern corresponding to the element isolation region 9 is added to the base mask pattern after formation of the base mask pattern as described above, the base mask pattern can be formed by a simple line-and-space pattern. Thus, high optical resolution can be implemented when forming the base mask pattern, for reducing margins between the active regions. Therefore, the area of the memory cell 1 can be reduced similarly to that in the second embodiment.

A method of forming the element isolation region 9 in the third embodiment is now described with reference to FIGS. 6 to 10.

Figure 7:
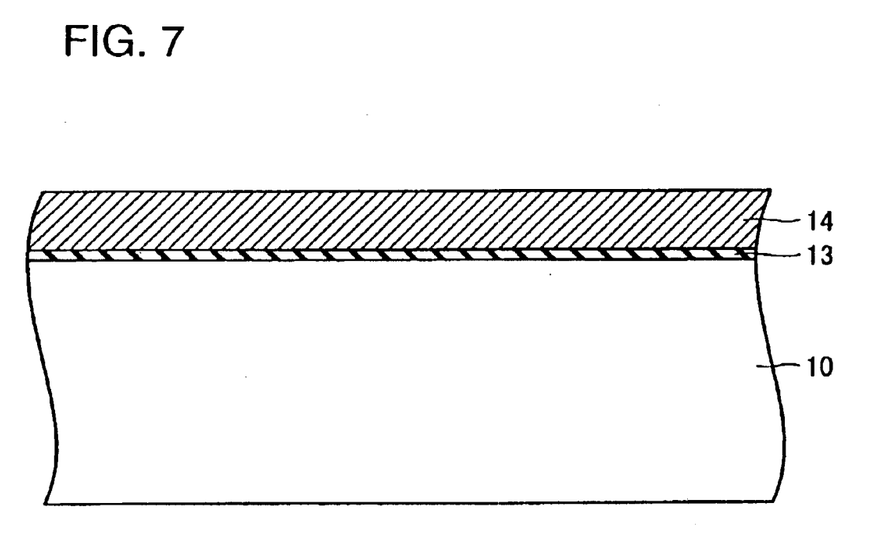
FIGS. 7 to 10 are sectional views showing first to fourth steps for fabricating the memory cell of the SRAM according to the third embodiment of the present invention.

As shown in FIG. 7, a silicon oxide film 13 of about 30 nm in thickness is formed on the main surface of a silicon substrate 10 by thermal oxidation or CVD (chemical vapor deposition). A silicon nitride film 14 of about 150 nm in thickness is formed on the silicon oxide film 13 by CVD, for example.

Then, photoresist films (mask films) identical in shape to active regions 2a to 2e shown in FIG. 5 are formed on the silicon nitride film 14 by photolithography. At this time, the photoresist films may be formed as a plurality of linear patterns, i.e., simple line-and-space patterns vertically arranged at intervals similarly to the active regions 2a to 2e shown in FIG. 5, whereby high optical resolution can be implemented. Thus, photoresist patterns of prescribed shapes are obtained.

The silicon nitride film 14 is etched through the aforementioned photoresist patterns serving as masks and patterned in the same shapes as the photoresist patterns, thereby obtaining base mask patterns. Thereafter the photoresist films are removed.

Figure 8:
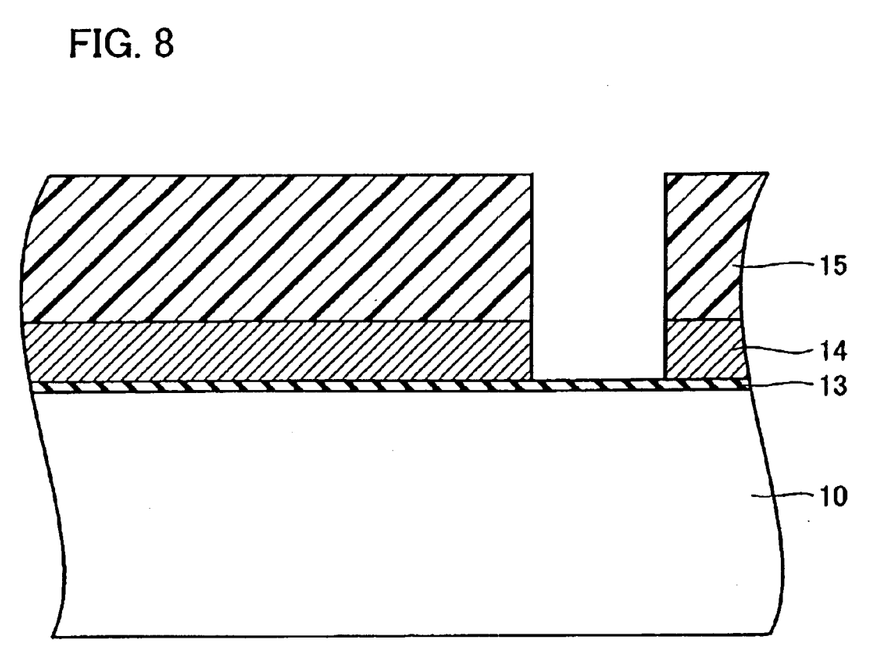

Then, a photoresist pattern 15 having an opening on a region for forming the element isolation region 9 is formed as shown in FIG. 8. This photoresist pattern 15 is employed as a mask for etching the silicon nitride film 14, thereby removing a portion of the silicon nitride film 14 located on the region for forming the element isolation region 9. Thereafter the photoresist pattern 15 is removed.

Figure 9:
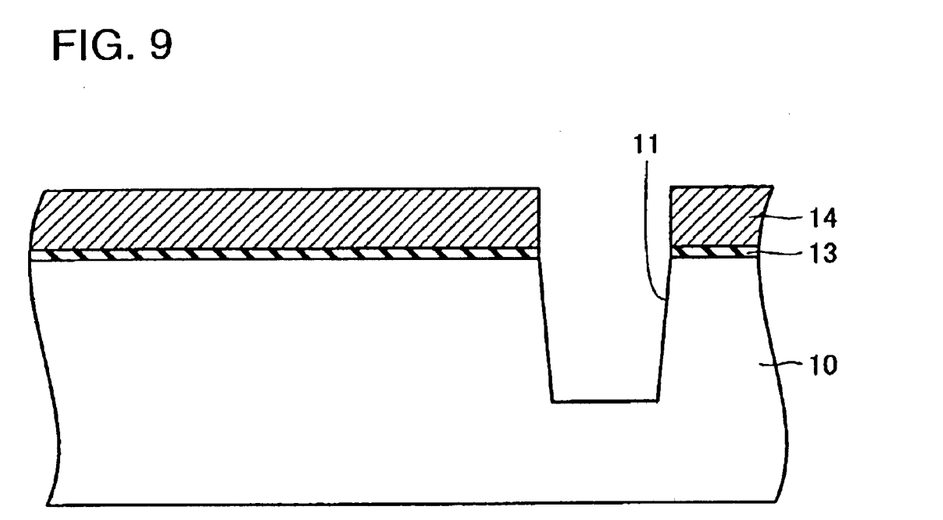

Then, the silicon oxide film 13 is partially removed by etching through the silicon nitride film 14 serving as a mask, and the silicon substrate 10 is thereafter etched by about 300 nm, thereby forming the trench 11 as shown in FIG. 9.

Then, a silicon oxide film 12 of about 500 nm in thickness is deposited on the overall main surface of the silicon substrate 10 by CVD or the like and subjected to CMP (chemical mechanical polishing) to be flattened. Thus, the trench 11 can be filled up with the silicon oxide film 12 while exposing the silicon nitride film 14.

Figure 10:
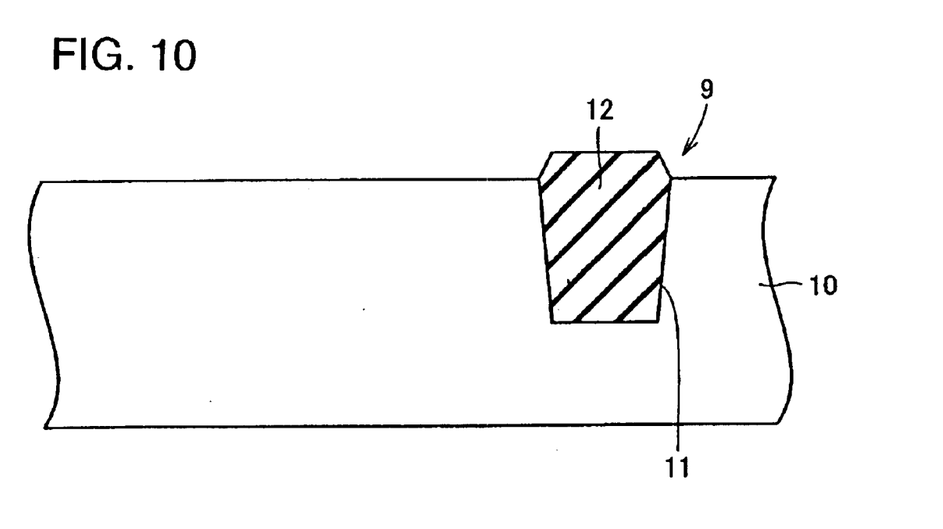

Thereafter the silicon nitride film 14 is removed through hot phosphoric acid, for example, and the silicon oxide film 13 is removed through hydrofluoric acid (HF), for example. Thus, the element isolation region (trench isolation region) 9 is formed as shown in FIG. 10.

Then, a prescribed impurity is injected into the main surface of the silicon substrate 10 for forming a well etc. Thereafter a silicon oxide film is formed by thermal oxidation or the like, and a polysilicon film doped with an impurity is formed on the silicon oxide film. The polysilicon film and the silicon oxide film are patterned for forming the gate insulator films 6a and 6b and the polysilicon wires (gate electrodes) 3b and 3c as shown in FIG. 6.

Then, a prescribed impurity is injected into each active region thereby forming an impurity region defining a source or drain region of each MOS transistor. Referring to FIG. 6, a p-type impurity such as boron is injected into the active region 2b thereby forming $p^+$ impurity regions 7a and 7b. The structure shown in FIG. 6 is obtained through the aforementioned steps.

According to the present invention, the gate widths of access and driver MOS transistors are equalized with each other so that all active regions can be simply linearly shaped. While mask patterns such as resist patterns are generally employed for forming the active regions, optical resolution can be improved in formation of the mask patterns when the active regions have simple linear shapes as described above. Thus, the mask patterns can be precisely and stably formed. Fluctuation of the widths of the active regions (active region patterns) formed through such mask patterns can be reduced also when the SRAM is refined, whereby not only reliability but also performance of the static semiconductor memory device can be inhibited from reduction.

When the gate width of the load MOS transistors is rendered smaller than those of the access and driver MOS transistors, the write operation of the static semiconductor memory device can be stabilized.

When the gate width of the load MOS transistors is rendered larger than those of the access and driver MOS transistors, the read operation of the static semiconductor memory device can be stabilized.

When the gate width of the load MOS transistors is equalized with those of the access and driver MOS transistors, the widths of all active regions can be equalized with each other and the active regions can be precisely formed. Consequently, margins for forming the active regions can be reduced for refining memory cells of the static semiconductor memory device.

When the first separation width between the access MOS transistors adjacent to each other along the gate width direction thereof, the second separation width between the driver MOS transistors adjacent to each other along the gate width direction thereof and the third separation width between the load MOS transistors adjacent to each other along the gate width direction thereof are equalized with each other, separation widths between prescribed active regions can be equalized with each other. This can also contribute to refinement of the memory cells of the static semiconductor memory device.

When the fourth separation width between the load MOS transistors adjacent to each other along the gate length direction thereof and the aforementioned first, second and third separation widths are equalized with each other, the active region patterns can be further regularly arranged. This can also contribute to refinement of the memory cells of the static semiconductor memory device.

When the fifth separation width between the load MOS transistor and the driver MOS transistor adjacent to each other along the gate width direction of the load MOS transistor, the sixth separation width between the load MOS transistor and the access MOS transistor adjacent to each other along the gate width direction of the access MOS transistor and the aforementioned first, second and third separation widths are equalized with each other, separation widths between all active regions can be equalized with each other. Thus, the memory cells of the static semiconductor memory device can be further refined.

When active regions are continuously formed between the load MOS transistors adjacent to each other along the gate length direction thereof while forming isolation elements on active regions located between the load MOS transistors, mask patterns for forming the active regions can be formed as simple line-and-space patterns. Thus, the active regions can be further precisely formed for enabling refinement of the memory cells of the static semiconductor memory device.

When trench isolation regions are provided for dividing the active regions located between the load MOS transistors adjacent to each other along the gate length direction thereof, the active regions (active region patterns) can be formed through mask patterns prepared by forming base patterns for forming active regions consisting of simple line-and-space patterns and thereafter forming patterns for forming the aforementioned trench isolation regions on prescribed positions of the base patterns, for example. Also in this case, the base patterns can be precisely formed for reducing margins between the active regions, thereby enabling refinement of the memory cells of the static semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:
    a memory cell including an access MOS (metal oxide semiconductor) transistor, a driver MOS transistor and a load MOS transistor;
    a first wire forming a gate of said access MOS transistor; and
    a second wire extending in a same direction as said first wire for forming a gate of said driver MOS transistor and a gate of said load MOS transistor, wherein
    a gate width of said access MOS transistor and a gate width of said driver MOS transistor are equalized with each other, wherein
    a gate width of said load MOS transistor is rendered smaller than the gate width of said access MOS transistor and the gate width of said driver MOS transistor.

2. A static semiconductor memory device comprising:
    a memory cell including an access MOS (metal oxide semiconductor) transistor, a driver MOS transistor and a load MOS transistor;
    a first wire forming a gate of said access MOS transistor; and
    a second wire extending in a same direction as said first wire for forming a gate of said driver MOS transistor and a gate of said load MOS transistor, wherein
    a gate width of said access MOS transistor and a gate width of said driver MOS transistor are equalized with each other, wherein
    a gate width of said load MOS transistor is rendered larger than the gate width of said access MOS transistor and the gate width of said driver MOS transistor.

3. The static semiconductor memory device according to claim 1, wherein
    the gate width of said load MOS transistor is equalized with the gate width of said access MOS transistor and the gate width of said driver MOS transistor.

4. The static semiconductor memory device according to claim 1, wherein
    a first separation width between access MOS transistors adjacent to each other along a gate width direction of said access MOS transistor, a second separation width between driver MOS transistors adjacent to each other along a gate width direction of said driver MOS transistor and a third separation width between load MOS transistors adjacent to each other along a gate width direction of said load MOS transistor are equalized with each other.

5. The static semiconductor memory device according to claim 4, wherein
    a fourth separation width between load MOS transistors adjacent to each other along a gate length direction of said load MOS transistor and said first, second and third separation widths are equalized with each other.

6. A static semiconductor memory device comprising:
    a memory cell including an access MOS (metal oxide semiconductor) transistor, a driver MOS transistor and a load MOS transistor;
    a first wire forming a gate of said access MOS transistor; and
    a second wire extending in a same direction as said first wire for forming a gate of said driver MOS transistor and a gate of said load MOS transistor, wherein
    a gate width of said access MOS transistor and a gate width of said driver MOS transistor are equalized with each other, wherein a first separation width between access MOS transistors adjacent to each other along a gate width direction of said access MOS transistor, a second separation width between driver MOS transistors adjacent to each other along a gate width direction of said driver MOS transistor and a third separation width between load MOS transistors adjacent to each other along a gate width direction of said load MOS transistor are equalized with each other, and a fifth separation width between said load MOS transistor and said driver MOS transistor adjacent to each other along the gate width direction of said load MOS transistor, a sixth separation width between said load MOS transistor and said access MOS transistor adjacent to each other along the gate width direction of said access MOS transistor and said first, second and third separation widths are equalized with each other.

7. A static semiconductor memory device comprising:

a memory cell including an access MOS (metal oxide semiconductor) transistor, a driver MOS transistor and a load MOS transistor;

a first wire forming a gate of said access MOS transistor;

a second wire extending in same direction as said first wire for forming a gate of said driver MOS transistor and a gate of said load MOS transistor, a gate width of said access MOS transistor and a gate width of said driver MOS transistor being equalized with each other; and an active region including a source region and a drain region of said load MOS transistor, wherein said active region is continuously formed between load MOS transistors adjacent to each other along a gate length direction of said load MOS transistor, and an isolation element is formed on said active region located between said load MOS transistors.

8. The static semiconductor memory device according to claim 7, wherein said isolation element includes a MOS transistor having a higher threshold voltage than said load MOS transistor.

9. A static semiconductor memory device comprising:

a memory cell including an access MOS (metal oxide semiconductor) transistor, a driver MOS transistor and a load MOS transistor;

a first wire forming a gate of said access MOS transistor;

a second wire extending in a same direction as said first wire for forming a gate of said driver MOS transistor and a gate of said load MOS transistor, a gate width of said access MOS transistor and a gate width of said driver MOS transistor being equalized with each other; and an active region including a source region and a drain region of said load MOS transistor, and a trench isolation region provided to divide said active region located between load MOS transistors adjacent to each other along a gate length direction of said load MOS transistor.

* * * * *